US012317935B2

United States Patent
Kim et al.

(10) Patent No.: US 12,317,935 B2
(45) Date of Patent: Jun. 3, 2025

(54) AEROSOL-GENERATING DEVICE FOR DETECTING INSERTION OF AEROSOL-GENERATING ARTICLE AND METHOD OF OPERATING THE SAME

(71) Applicant: KT&G CORPORATION, Daejeon (KR)

(72) Inventors: Yong Hwan Kim, Anyang-si (KR); Sung Wook Yoon, Suwon-si (KR); Seung Won Lee, Gyeonggi-do (KR); Seok Su Jang, Daejeon (KR); Dae Nam Han, Seoul (KR)

(73) Assignee: KT&G Corporation, Daejeon (KR)

( * ) Notice: Subject to any disclaimer, the term of this patent is extended or adjusted under 35 U.S.C. 154(b) by 342 days.

(21) Appl. No.: 17/801,171

(22) PCT Filed: Jun. 29, 2021

(86) PCT No.: PCT/KR2021/008148
§ 371 (c)(1),
(2) Date: Aug. 19, 2022

(87) PCT Pub. No.: WO2022/039378
PCT Pub. Date: Feb. 24, 2022

(65) Prior Publication Data
US 2023/0097359 A1    Mar. 30, 2023

(30) Foreign Application Priority Data
Aug. 19, 2020  (KR) .................. 10-2020-0104104

(51) Int. Cl.
*A24F 13/00* (2006.01)
*A24F 40/20* (2020.01)
(Continued)

(52) U.S. Cl.
CPC .............. *A24F 40/53* (2020.01); *A24F 40/20* (2020.01); *A24F 40/465* (2020.01); *A24F 40/51* (2020.01);
(Continued)

(58) Field of Classification Search
CPC ....................................... A24F 47/00
(Continued)

(56) References Cited

U.S. PATENT DOCUMENTS 6,316,931 B1    11/2001  Nakagawa et al.
2018/0132536 A1   5/2018  Henry
(Continued)

FOREIGN PATENT DOCUMENTS

CN    106455714 A    2/2017
CN    106455722 A    2/2017
(Continued)

OTHER PUBLICATIONS

International Search Report for PCT/KR2021/008148 dated Oct. 8, 2021 [PCT/ISA/210].
(Continued)

*Primary Examiner* — Phuong K Dinh
(74) *Attorney, Agent, or Firm* — Foley & Lardner LLP

(57) ABSTRACT

According to some embodiments, an aerosol-generating device includes: an inductive sensor that detects a change in inductance; an induction coil configured to generate a time-varying magnetic field by a current; a susceptor configured to heat an aerosol-generating article inserted into an accommodation space of the aerosol-generating device according to the time-varying magnetic field; a controller configured to: determine whether the aerosol-generating article is inserted into the accommodation space based on the change in inductance detected by the inductive sensor, start heating the susceptor by applying the current to the induction coil
(Continued)

based on determining that the aerosol-generating article is inserted into the accommodation space, measure a frequency response of a coupling circuit formed in response to the current being applied to the induction coil, and determine whether to continue to heat the susceptor based on the measured frequency response.

11 Claims, 6 Drawing Sheets

(51) Int. Cl.

| | |
|---|---|
| *A24F 40/465* | (2020.01) |
| *A24F 40/51* | (2020.01) |
| *A24F 40/53* | (2020.01) |
| *A24F 40/57* | (2020.01) |
| *A24F 40/60* | (2020.01) |
| *G01D 5/20* | (2006.01) |
| *G01R 27/26* | (2006.01) |
| *H05B 6/06* | (2006.01) |
| *H05B 6/10* | (2006.01) |

(52) U.S. Cl.
CPC ............. *A24F 40/57* (2020.01); *A24F 40/60* (2020.01); *G01D 5/2006* (2013.01); *G01R 27/2611* (2013.01); *H05B 6/06* (2013.01); *H05B 6/105* (2013.01)

(58) Field of Classification Search
USPC .................................................. 131/328–329
See application file for complete search history.

(56) References Cited

U.S. PATENT DOCUMENTS

| | | |
|---|---|---|
| 2019/0302193 A1 | 10/2019 | Maru et al. |
| 2020/0022412 A1 | 1/2020 | Abi Aoun et al. |
| 2020/0037402 A1 | 1/2020 | Abi Aoun et al. |
| 2020/0154773 A1 | 5/2020 | Lim et al. |
| 2021/0076736 A1 | 3/2021 | Fernando et al. |
| 2021/0169145 A1* | 6/2021 | Lee .......................... H02J 50/90 |
| 2024/0306705 A1 | 9/2024 | Mironov |

FOREIGN PATENT DOCUMENTS

| | | |
|---|---|---|
| CN | 109619695 A | 4/2019 |
| CN | 110476477 A | 11/2019 |
| KR | 10-2011-0096548 A | 8/2011 |
| KR | 10-2019-0130021 A | 11/2019 |
| KR | 10-2020-0061233 A | 6/2020 |
| WO | WO-00/36427 A1 | 6/2000 |
| WO | 2015/176898 A1 | 11/2015 |
| WO | 2015/177247 A1 | 11/2015 |
| WO | 2015/177294 A1 | 11/2015 |
| WO | 2019/136165 A1 | 7/2019 |
| WO | 2020/020970 A1 | 1/2020 |
| WO | WO-2020/009407 A1 | 1/2020 |
| WO | 2020/043901 A1 | 3/2020 |
| WO | 2020/064686 A1 | 4/2020 |

OTHER PUBLICATIONS

Extended European Search Report issued Jun. 13, 2023 in Application No. 21858466.2.
China Office Action on CN Patent Application No. 202180029841.3 dated Mar. 28, 2025.

* cited by examiner

FIG. 5

| CIGARETTE ○ | | CIGARETTE × | |
|---|---|---|---|
| Frequency | Current | Frequency | Current |
| 125kHz | 2753 mA | 145kHz | 3633 mA |
| 125kHz | 2742 mA | 150kHz | 3677 mA |
| 124kHz | 2771 mA | 146kHz | 3662 mA |

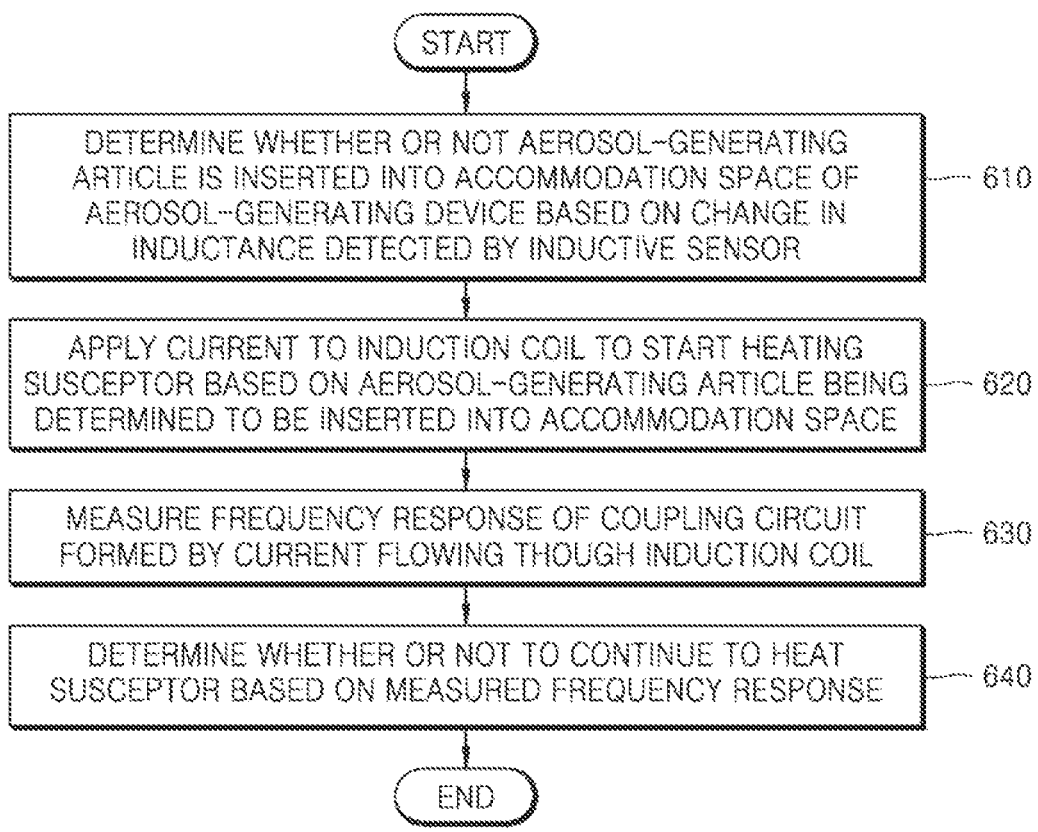

AEROSOL-GENERATING DEVICE FOR DETECTING INSERTION OF AEROSOL-GENERATING ARTICLE AND METHOD OF OPERATING THE SAME

TECHNICAL FIELD

The present disclosure relates to an aerosol-generating device that detects whether or not an aerosol-generating article is inserted and a method of operating the aerosol-generating device.

BACKGROUND ART

Recently, the demand for alternative methods to overcome the disadvantages of traditional cigarettes has increased. For example, there is growing demand for an aerosol generating device which generates aerosol by heating a cigarette or an aerosol generating material, rather than by combusting cigarettes.

DISCLOSURE

Technical Problem

When an aerosol-generating device is not in use, an unintended heating operation of the aerosol-generating device needs to be prevented. For example, when the aerosol-generating article is not inserted into an accommodation space of the aerosol-generating device, the user does not intend to use the aerosol-generating device, and thus, a heating operation of the aerosol-generating device has to be prevented. Therefore, in order to reliably prevent an unintended heating operation of the aerosol-generating device, it is necessary to accurately determine whether or not the aerosol-generating article is inserted into the accommodation space of the aerosol-generating device.

Various embodiments provide aerosol-generating devices that detect whether or not an aerosol-generating article is inserted and methods of operating the aerosol-generating devices. Technical problems to be solved by the present disclosure is not limited to the technical problems described above, and other technical problems may be inferred from the following embodiments.

Technical Solution

According to an aspect of the present disclosure, an aerosol-generating device includes an inductive sensor that detects a change in inductance, an induction coil configured to generate a time-varying magnetic field by a current; a susceptor configured to heat an aerosol-generating article inserted into an accommodation space of the aerosol-generating device according to the time-varying magnetic field; and a controller configured to: determine whether the aerosol-generating article is inserted into the accommodation space based on the change in inductance detected by the inductive sensor, start heating the susceptor by applying the current to the induction coil based on determining that the aerosol-generating article is inserted into the accommodation space, measure a frequency response of a coupling circuit formed in response to the current being applied to the induction coil, and determine whether to continue to heat the susceptor based on the measured frequency response.

Advantageous Effects

The present disclosure may provide an aerosol-generating device that detects whether or not an aerosol-generating article is inserted and a method of operating the aerosol-generating device. Specifically, the aerosol-generating device according to the present disclosure may determine whether an aerosol-generating article is inserted into an accommodation space of the aerosol-generating device based on a change in inductance detected by an inductive sensor. When it is determined that the aerosol-generating article is inserted into the accommodation space, the aerosol-generating device may start heating a susceptor by applying a current to an induction coil. That is, the aerosol-generating device according to the present disclosure may start a heating operation immediately after insertion of the aerosol-generating article is detected through a primary determination process using the inductive sensor. Accordingly, the susceptor may be quickly heated to a temperature at which an aerosol is generated from the aerosol-generating article. As a result, the reactivity of the aerosol-generating device may be increased.

Meanwhile, the aerosol-generating device according to the present disclosure may measure a frequency response of a coupling circuit formed in response to a current being applied to the induction coil and determine whether to continue to heat the susceptor based on the measured frequency response. As such, the aerosol-generating device may double check whether the aerosol-generating article is inserted into the accommodation space through a secondary determination process using the frequency response of the coupling circuit. The aerosol-generating device may stop the heating operation when it is determined that the aerosol-generating article is not inserted as a result of the secondary determination process. Even when there is an error in the primary determination process, an unintended heating operation of the aerosol-generating device may be prevented through a secondary determination process, thereby improving safety of the aerosol-generating device.

In addition, the aerosol-generating device according to the present disclosure may identify the type of aerosol-generating article in each of the primary determination process and the secondary determination process. Accordingly, even when the aerosol-generating article is inserted into the accommodation space of the aerosol-generating device, in a case where the inserted aerosol-generating article is not a dedicated aerosol-generating article, the heating operation of the aerosol-generating device may be prevented.

DESCRIPTION OF DRAWINGS

FIGS. 4 and 5 are diagrams illustrating a method of determining whether an aerosol-generating article is inserted and identifying the type of aerosol-generating article based on a frequency response by using an aerosol-generating device according to an example embodiment.

FIG. 6 is a flowchart illustrating a method of operating an aerosol-generating device, according to an example embodiment.

BEST MODE

Figure 1:
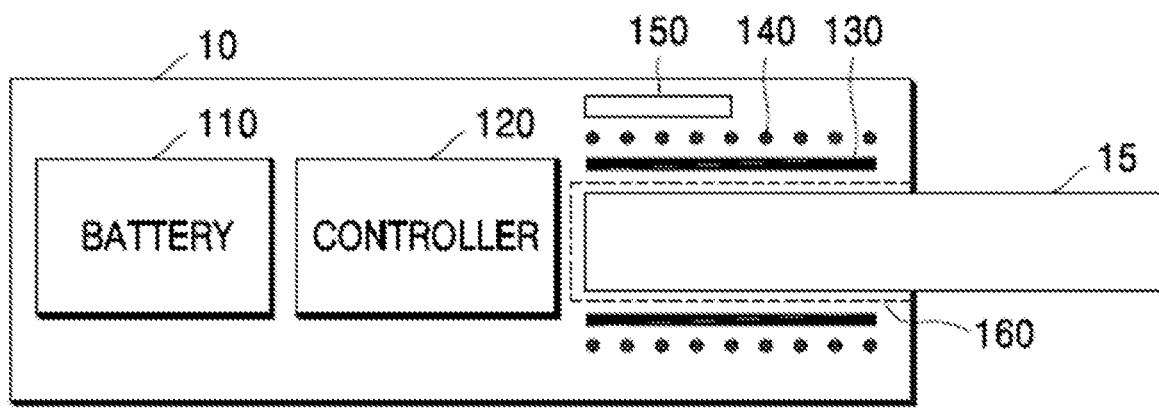
FIG. 1 is a diagram illustrating an aerosol-generating system according to an example embodiment.

According to an aspect of the present disclosure, an aerosol-generating device includes an inductive sensor configured to detect a change in inductance; an induction coil configured to generate a time-varying magnetic field by a current; a susceptor configured to heat an aerosol-generating article inserted into an accommodation space of the aerosol-generating device according to the time-varying magnetic field; and a controller configured to: determine whether the aerosol-generating article is inserted into the accommodation space based on the change in inductance detected by the inductive sensor, start heating the susceptor by applying the current to the induction coil based on determining that the aerosol-generating article is inserted into the accommodation space, measure a frequency response of a coupling circuit formed in response to the current being applied to the induction coil, and determine whether to continue to heat the susceptor based on the measured frequency response.

The controller may determine that the aerosol-generating article is inserted into the accommodation space based on the change in inductance detected by the inductive sensor exceeding a threshold.

In one example, the threshold may be preset based on a type of the aerosol-generating article.

The aerosol-generating device may further include a battery configured to supply power to the induction coil, wherein the controller may measure a change in the current while changing a driving frequency of the battery within a preset frequency scan range, and determine whether to continue to heat the susceptor based on the change in the current.

For example, the controller may stop heating the susceptor based on a difference between a first frequency response corresponding to the change in the current and a second frequency response that does not reflect the change in the current being within an error range, and continue to heat the susceptor based on the difference exceeding the error range.

The second frequency response may correspond to a frequency response measured while the aerosol-generating article is not inserted into the accommodation space and may be previously stored in the aerosol-generating device.

The controller may determine a resonance frequency of the coupling circuit based on the change in the current and may identify a type of the aerosol-generating article based on the determined resonance frequency.

The controller may stop heating the susceptor based on the identified type of the aerosol-generating article being different from a type of aerosol-generating article stored in the aerosol-generating device.

The aerosol-generating device may further include a user interface which outputs a notification that a dedicated aerosol-generating article has to be inserted into the accommodation space, based on the identified type of aerosol-generating article being different from the type of aerosol-generating article stored in the aerosol-generating device.

The aerosol-generating device may further include a user interface which outputs a notification that a dedicated aerosol-generating article has to be inserted into the accommodation space, based on the change in inductance detected by the inductive sensor not exceeding a threshold.

According to another aspect of the present disclosure, a method of operating an aerosol-generating device includes determining whether the aerosol-generating article is inserted into an accommodation space of the aerosol-generating device based on a change in inductance detected by an inductive sensor, applying a current to an induction coil to start heating a susceptor based on determining that the aerosol-generating article is inserted into the accommodation space, measuring a frequency response of a coupling circuit formed in response to the current being applied to the induction coil, and determining whether to continue to heat the susceptor based on the measured frequency response.

Mode for Invention

With respect to the terms used to describe the various embodiments, general terms which are currently and widely used are selected in consideration of functions of structural elements in the various embodiments of the present disclosure. However, meanings of the terms can be changed according to intention, a judicial precedence, the appearance of new technology, and the like. In addition, in certain cases, a term which is not commonly used can be selected. In such a case, the meaning of the term will be described in detail at the corresponding portion in the description of the present disclosure. Therefore, the terms used in the various embodiments of the present disclosure should be defined based on the meanings of the terms and the descriptions provided herein.

In addition, unless explicitly described to the contrary, the word "comprise" and variations such as "comprises" or "comprising" will be understood to imply the inclusion of stated elements but not the exclusion of any other elements. In addition, the terms "-er", "-or", and "module" described in the specification mean units for processing at least one function and operation and can be implemented by hardware components or software components and combinations thereof.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

The term "cigarette" (i.e., when used alone without a modifier such as "general," "traditional," or "combustive") may refer to any article which has a shape similar to a traditional combustive cigarette. This cigarette may contain an aerosol generating material that generates aerosols by operation (e.g., heating) of an aerosol generating device. Alternatively, the cigarette may not include an aerosol generating material but delivers an aerosol generated from another article (e.g., cartridge) installed in the aerosol generating device.

It will be understood that when an element or layer is referred to as being "over," "above," "on," "connected to" or "coupled to" another element or layer, it can be directly over, above, on, connected or coupled to the other element or layer or intervening elements or layers may be present. In contrast, when an element is referred to as being "directly over," "directly above," "directly on," "directly connected to" or "directly coupled to" another element or layer, there are no intervening elements or layers present. Like numerals refer to like elements throughout.

Hereinafter, the present disclosure will now be described more fully with reference to the accompanying drawings, in which exemplary embodiments of the present disclosure are shown such that one of ordinary skill in the art may easily work the present disclosure. The disclosure may, however, be embodied in many different forms and should not be construed as being limited to the embodiments set forth herein.

Hereinafter, embodiments of the present disclosure will be described in detail with reference to the drawings.

FIG. 1 is a diagram illustrating an aerosol-generating system according to an example embodiment.

Referring to FIG. 1, an aerosol-generating system may include an aerosol-generating device 10 and an aerosol-generating article 15. The aerosol-generating device 10 may include an accommodation space 160 into which the aerosol-generating article 15 is inserted and may generate an aerosol by heating the aerosol-generating article 15 inserted into the accommodation space 160. The aerosol-generating article 15 may correspond to a cigarette but is not limited thereto. The aerosol-generating article 15 may include any article as long as the article includes an aerosol-generating material.

The aerosol-generating device 10 may include a battery 110, a controller 120, a susceptor 130, an induction coil 140, and an inductive sensor 150. However, an internal structure of the aerosol-generating device 10 is not limited to the structure illustrated in FIG. 1. Those skilled in the art relating to the present embodiment will appreciate that some of the hardware configurations illustrated in FIG. 1 may be omitted or a new configuration may be added thereto depending on design of the aerosol-generating device 10.

The battery 110 may supply power used to operate the aerosol-generating device 10. For example, the battery 110 may supply power such that the induction coil 140 generates a time-varying magnetic field. In addition, the battery 110 may supply power required for operations of other hardware components included in the aerosol-generating device 10, such as various sensors, a user interface, a memory, and the controller 120. The battery 110 may include a rechargeable battery or a disposable battery. For example, the battery 110 may include a lithium polymer (LiPoly) battery but is not limited thereto.

The controller 120 controls the overall operation of the aerosol-generating device 10. For example, the controller 120 may control operation of the battery 110, the susceptor 130, the induction coil 140, and the inductive sensor 150 as well as other components included in the aerosol-generating device 10. In addition, the controller 120 may also determine whether the aerosol-generating device 10 is in an operable state by checking states of the respective components of the aerosol-generating device 10.

The controller 120 may include at least one processor. The processor may also include an array of a plurality of logic gates or may include a combination of a microprocessor and a memory for storing a program that may be executed by the microprocessor. In addition, those skilled in the art to which the present embodiment belongs may appreciate that the processor may include other types of hardware.

The susceptor 130 may include a material that is heated when a time-varying magnetic field is applied. For example, the susceptor 130 may include metal or carbon. The susceptor 130 may include at least one of ferrite, ferromagnetic alloy, stainless steel, and aluminum (Al). In addition, the susceptor 130 may include at least one of ceramic (e.g., graphite, molybdenum, silicon carbide, niobium, nickel alloy, metal film, or zirconia), a transition metal (e.g., nickel (Ni) or cobalt (Co)), and a metalloid (e.g., boron (B) or phosphorus (P)). However, the present disclosure is not limited thereto.

In one example, the susceptor 130 may have a tubular shape or a cylindrical shape and may be arranged to surround the accommodation space 160 into which the aerosol-generating article 15 is inserted into. When the aerosol-generating article 15 is inserted into the accommodation space 160 of the aerosol-generating device 10, the susceptor 130 may be arranged to surround the aerosol-generating article 15. Accordingly, a temperature of the aerosol-generating material in the aerosol-generating article 15 may be increased by heat transferred from the external susceptor 130.

However, the susceptor 130 illustrated in FIG. 1 is only an example, and the present disclosure is not limited thereto. The susceptor 130 may have a shape other than the tubular shape or the cylindrical shape, and may be inserted into the aerosol-generating article 15 when the aerosol-generating article 15 is placed in the accommodation space 160. In another example, the susceptor may be arranged inside the aerosol-generating article 15. In this case, the temperature of the aerosol-generating material in the aerosol-generating article 15 may be increased by heat transferred from the internal susceptor 130.

The induction coil 140 may generate a time-varying magnetic field when power is supplied from the battery 110. The time-varying magnetic field generated by the induction coil 140 may be applied to the susceptor 130, and thus, the susceptor 130 may be heated. Power supplied to the induction coil 140 may be adjusted under the control of the controller 120, so that the temperature at which the susceptor 130 is heated may be properly maintained.

The inductive sensor 150 may detect whether the aerosol-generating article 15 is inserted into the accommodation space 160 of the aerosol-generating device 10. In one example, the aerosol-generating article 15 may include a metal material such as aluminum, and the inductive sensor 150 may detect a change in inductance generated as the aerosol-generating article 15 is inserted into the accommodation space 160. However, the present disclosure is not limited thereto, and the inductive sensor 150 may be replaced with another sensor such as an optical sensor, a temperature sensor, or a resistance sensor.

When insertion of the aerosol-generating article 15 is detected, the controller 120 may automatically perform a heating operation without an additional external input. For example, when the inductive sensor 150 has detected that the aerosol-generating article 15 is inserted, the controller 120 may control the battery 110 to supply power to the induction coil 140. As a time-varying magnetic field is generated by the induction coil 140, the susceptor 130 may be heated. Accordingly, the aerosol-generating article 15 adjacent to the susceptor 130 may be heated, thereby generating an aerosol. However, the present disclosure is not limited thereto. For example, the controller 120 may perform a heating operation only when there is an additional external input. Also, the inductive sensor 150 may detect whether the aerosol-generating article 15 is inserted only when there is an external input.

In addition, the aerosol-generating device 10 may further include other components in addition to the battery 110, the controller 120, the susceptor 130, the induction coil 140, and the inductive sensor 150. For example, the aerosol-generating device 10 may further include other sensors (for example, a temperature detecting sensor, a puff detecting sensor, and so on), a user interface, and a memory in addition to the inductive sensor 150.

The user interface may provide information on a state of the aerosol-generating device 10 to a user. The user interface may include a display or lamp that outputs visual information, a motor that outputs tactile information, a speaker that outputs sound information, and input/output (I/O) interfacing units (for example, buttons or a touch screen) that receive information input from a user or outputs information to the user. In addition, the user interface may include various interfacing units such as terminals for data communication or receiving charging power, and a communication interfacing module (for example, WI-FI, WI-FI Direct, Bluetooth, Bluetooth low energy (BLE), near-field communication (NFC), and so on) for wireless communication with an external device.

However, the aerosol-generating device 10 may selectively include only some of the various user interface examples illustrated above. In addition, the aerosol-generating device 10 may include a combination of at least some of the various user interface examples illustrated above. For example, the aerosol-generating device 10 may include a touch screen display capable of receiving user input while outputting visual information on a front side thereof. The touch screen display may include a fingerprint sensor, and user authentication may be performed by the fingerprint sensor.

The memory is hardware that stores various types of data processed by the aerosol-generating device 10, and the memory may store the data processed by the controller 120 and data to be processed. The memory may include various types of memories, for example, random access memory (RAM) such as dynamic RAM (DRAM) or static RAM (SRAM), read-only memory (ROM), electrically erasable programmable read-only memory (EEPROM), and so on. The memory may store an operation time of the aerosol-generating device 10, a maximum number of puffs, a current number of puffs, at least one temperature profile, and data about a user's smoking pattern.

Figure 2:
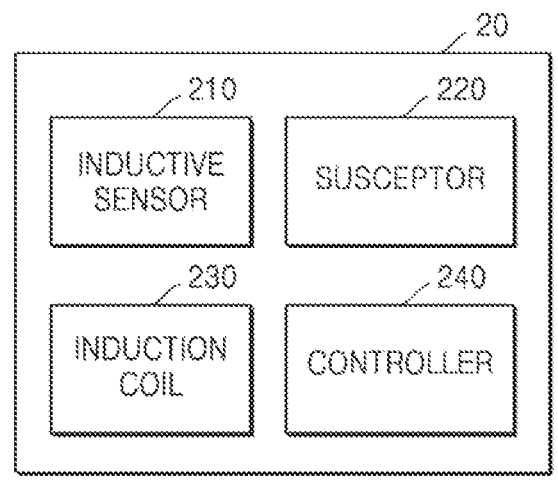
FIG. 2 is a block diagram illustrating a configuration of an aerosol-generating device according to an example embodiment.

FIG. 2 is a block diagram illustrating a configuration of an aerosol-generating device according to an example embodiment.

Referring to FIG. 2, an aerosol-generating device 20 may include an inductive sensor 210, a susceptor 220, an induction coil 230, and a controller 240. FIG. 2 illustrates the aerosol-generating device 20 including components relating to the present embodiment. Accordingly, those skilled in the art relating to the present embodiment will appreciate that components other than the components illustrated in FIG. 2 may be further included in the aerosol-generating device 20. For example, the aerosol-generating device 20 may further include a battery (for example, the battery 110 of FIG. 1). In addition, the inductive sensor 210, the susceptor 220, the induction coil 230, and the controller 240 of FIG. 2 may correspond respectively to the inductive sensor 150, the susceptor 130, the induction coil 140, and the controller 120 of FIG. 1. Accordingly, redundant descriptions thereof are omitted.

The controller 240 may determine whether an aerosol-generating article is inserted into an accommodation space based on a change in inductance detected by the inductive sensor 210. For example, when a magnitude of the change in inductance detected by the inductive sensor 210 exceeds a threshold, the controller 240 may determine that the aerosol-generating article is inserted into the accommodation space.

The aerosol-generating article may include a material that may be detected by the inductive sensor 210, such as a metal or a magnetic material. The magnitude of a change in inductance generated when the aerosol-generating article is inserted into the accommodation space of the aerosol-generating device 20 may vary depending on the type or amount of the material included in an aerosol-generating article. Accordingly, a threshold may be preset based on the type of aerosol-generating article. As such, in a primary determination process using the inductive sensor, not only insertion of an aerosol-generating article, but also authenticity of an aerosol-generating article and/or the type of an aerosol-generating article may be identified.

When the change in inductance is detected by the inductive sensor 210 but a magnitude of the change in inductance does not exceed the threshold, the controller 240 may determine that the inserted aerosol-generating article is not genuine and notify a user that a genuine aerosol-generating article has to be inserted into the accommodation space. However, the present disclosure is not limited thereto. Because the change in inductance of the magnitude not exceeding the threshold may be also caused by an external factor such as a magnet, a different notification may be provided. Notification may be provided through a user interface.

In addition, when it is determined that the aerosol-generating article is inserted into the accommodation space, the controller 240 may apply a current to the induction coil 230 to start heating of the susceptor 220. As such, the aerosol-generating device 20 according to the present disclosure may immediately start a heating operation when insertion of the aerosol-generating article is detected through the primary determination process using the inductive sensor 210. Accordingly, a temperature of the susceptor 220 may be rapidly increased up to a temperature at which an aerosol is generated in the aerosol-generating article. In other words, the reactivity of the aerosol-generating device 20 may be increased.

The controller 240 may measure a frequency response of a coupling circuit formed by applying a current to the induction coil 230 and determine whether to continue to heat the susceptor 220 based on the measured frequency response. The controller 240 may measure a change in intensity of a current applied to the induction coil 230 while changing a drive frequency of the battery within a preset frequency scan range, and may determine whether or not to continue to heat the susceptor 220 based on the change in intensity of the measured current. Hereinafter, a method of measuring a frequency response and determining whether to continue to heat the susceptor 220 based on the measured frequency response will be described in detail with reference to FIGS. 3 to 5.

Figure 3:
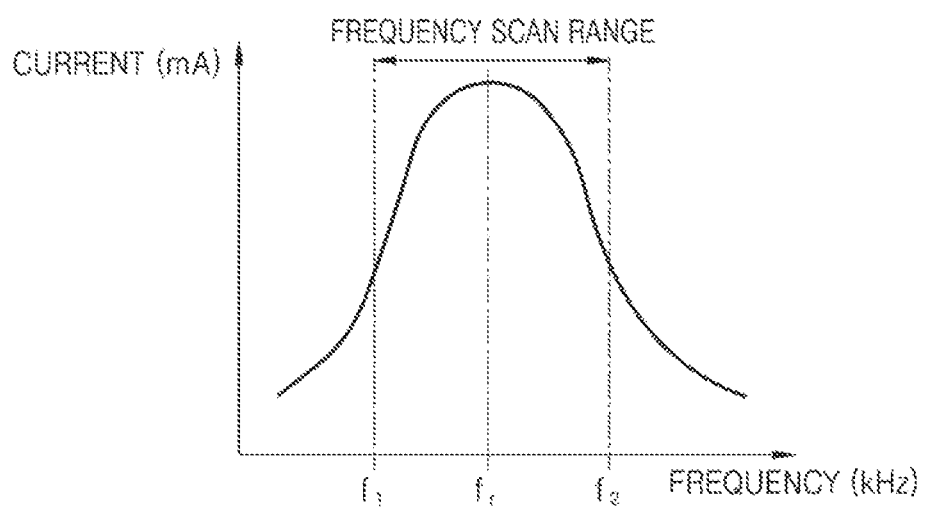
FIG. 3 is a diagram illustrating a process of measuring a frequency response by using an aerosol-generating device according to an example embodiment.

FIG. 3 is a diagram illustrating a process of measuring a frequency response by using the aerosol-generating device according to the example embodiment.

Referring to FIG. 3, an example of a frequency response of a coupling circuit is illustrated. When a current is applied to an induction coil, inductive coupling may be formed between a susceptor and the induction coil, and thus, a coupling circuit including the susceptor and the induction coil may be formed. The frequency response may represent a change in electrical characteristics according to a drive frequency of the coupling circuit. For example, as illustrated in FIG. 3, the frequency response is a function of the drive frequency of a battery that applies power to the induction coil and may represent a change in intensity of a current applied to the induction coil.

In addition, a controller (for example, the controller 240 of FIG. 2) may measure the frequency response while changing the drive frequency of the battery within a preset frequency scan range. For example, as illustrated in FIG. 3, the preset frequency scan range may be from $f_1$ to $f_2$. The controller may determine a resonance frequency (for example, $f_r$ of FIG. 3) of the coupling circuit by measuring a frequency response corresponding to the preset frequency scan range. A current or a voltage may be largest when the resonance frequency of the coupling circuit matches the drive frequency of the battery. Accordingly, the controller may determine the drive frequency of the battery that causes the intensity of a current flowing though the induction coil to reach its peak, as the resonance frequency of the coupling circuit. The controller may adjust the drive frequency of the battery to a resonance frequency of the coupling circuit or a frequency adjacent to the resonance frequency to obtain optimal heat efficiency.

As an aerosol-generating article including a metal or a magnetic material is inserted into an accommodation space of an aerosol-generating device, electrical or magnetic properties of the coupling circuit may be changed, and thus, the frequency response of the coupling circuit may be changed. Accordingly, the controller may determine whether an aerosol-generating article is inserted based on the frequency response of the coupling circuit.

Figure 4:
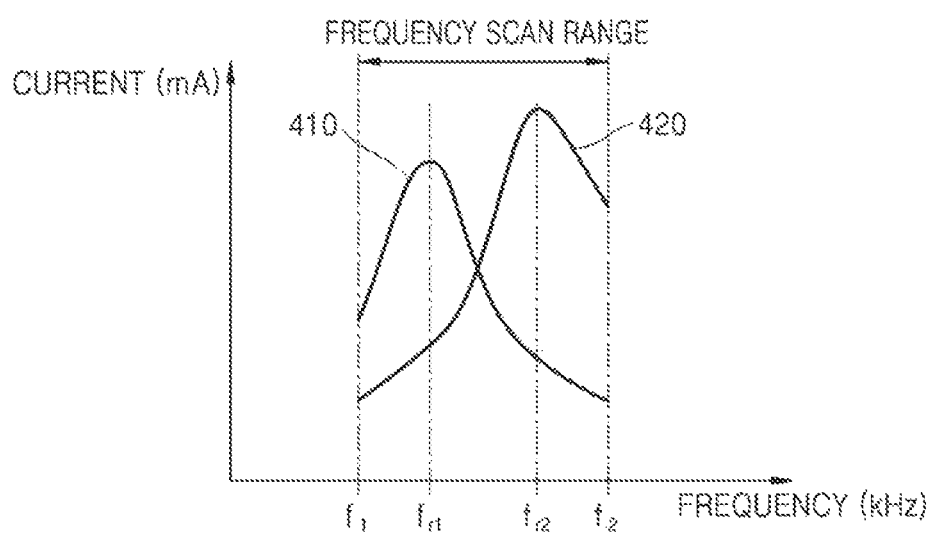

FIGS. 4 and 5 are diagrams illustrating a method of determining whether or not an aerosol-generating article is inserted or identifying the type of aerosol-generating article based on a frequency response by using the aerosol-generating device according to the example embodiment.

Referring to FIG. 4, a first frequency response 410 and a second frequency response 420 are illustrated. In one example, the first frequency response 410 may be measured while an aerosol-generating article is inserted into an accommodation space of the aerosol-generating device, and the second frequency response 420 may be measured while the accommodation space of the aerosol-generating device is empty.

The first frequency response 410 may have a smaller peak current value than the second frequency response 420. In addition, a resonance frequency $f_{r1}$ of the first frequency response 410 may have a value lower than a resonance frequency $f_{r2}$ of the second frequency response 420. The first frequency pattern 410 may have a shape similar to the second frequency pattern 420 that is shifted to the left within a frequency scan range $f_1$ to $f_2$. That is, a frequency response may change depending on whether the aerosol-generating article is inserted into the accommodation space of the aerosol-generating device, and thus, a controller (for example, the controller 240 of FIG. 2) may determine whether the aerosol-generating article is inserted based on the frequency response.

FIG. 5 illustrates a table representing the intensity of a current according to different drive frequencies when an aerosol-generating article (for example, a cigarette) is inserted into the accommodation space of the aerosol-generating device and when the aerosol-generating article is not inserted.

Referring to the left column of the table, a drive frequency is 124 kHz when the intensity of the current is greatest. Accordingly, it can be seen that a resonance frequency of a coupling circuit is 124 kHz when the aerosol-generating article is inserted into the accommodation space. On the other hand, referring to the right column of the table, the drive frequency is 150 kHz when the intensity of the current is the greatest. Accordingly, it can be seen that the resonance frequency of the coupling circuit is 150 kHz when the aerosol-generating article is not inserted into the accommodation space. As such, the resonance frequency of the coupling circuit changes depending on whether the aerosol-generating article is inserted into the accommodation space of the aerosol-generating device, and thus, a controller (for example, the controller 240 in FIG. 2) may determine whether an aerosol-generating article is inserted based on the resonance frequency of the coupling circuit.

Although the resonance frequency of the coupling circuit is 124 kHz when the aerosol-generating article used in the example FIG. 5 is inserted, the resonance frequency of the same coupling circuit may have a different value when another type of aerosol-generating article is inserted into the accommodation space. That is, the resonance frequency of the coupling circuit may differ depending on the type of aerosol-generating article, and thus, the controller may also identify the type of aerosol-generating article based on the resonance frequency of the coupling circuit. To this end, information about a resonance frequency corresponding to the type of aerosol-generating article may be previously stored in the aerosol-generating device. Alternatively, the aerosol-generating device may obtain such information in real time via wireless communication.

Referring back to FIG. 2, the controller 240 may stop heating the susceptor 220 when a difference (e.g., a difference in the resonance frequency or the peak current value) between the first frequency response and the second frequency response is within an error range. This is because a small difference within an error range between the first frequency pattern and the second frequency pattern may occur even if the aerosol-generating article is not inserted into the accommodation space of the aerosol-generating device 20. In this case, the controller 240 may determine that there is an error in the primarily determining process in which whether the aerosol-generating article is inserted is determined by using the inductive sensor, and may stop the heating operation that has been initiated according to the primarily determining process.

As such, the aerosol-generating device 20 according to the present disclosure may double check whether the aerosol-generating article is inserted, through a secondary determination process using a frequency response of a coupling circuit. The aerosol-generating device 20 may stop a heating operation when it is determined that the aerosol-generating article is not inserted into an accommodation space as a result of the secondary determination process. Accordingly, even when there is an error in the primary determination process, an abnormal heating operation of the aerosol-generating device 20 may be prevented through the second determination process, and thus, the safety of the aerosol-generating device 20 may be improved.

On the other hand, when the first frequency response and the second frequency response have a difference exceeding the error range, the controller 240 may continue to heat the susceptor. This is because the fact that the first frequency response and the second frequency response have the difference exceeding the error range means that the aerosol-generating article is inserted into the accommodation space of the aerosol-generating device 20. The second frequency response may be previously stored in the aerosol-generating device 20, but the present disclosure is not limited thereto. For example, the second frequency response may be measured in real time by the aerosol-generating device 20.

The controller 240 may determine the resonance frequency of the coupling circuit based on a change in intensity of the measured current and may identify the type of aerosol-generating article based on the determined resonance frequency. Even when the first frequency response and the second frequency response have the difference exceeding the error range, in a case where it is determined that the identified type of aerosol-generating article is different from the type of aerosol-generating article stored in the aerosol-generating device 20, the controller 240 may stop heating the susceptor. The type of aerosol-generating article stored in the aerosol-generating device 20 may represent a dedicated aerosol-generating article for the aerosol-generating device 20.

When it is determined that the identified type of aerosol-generating article is different from the type of aerosol-generating article stored in the aerosol-generating device 20, the controller 240 may notify a user that the dedicated aerosol-generating article has to be inserted into the accommodation space. Notification may be provided through a user interface.

As described above, the aerosol-generating device 20 according to the present disclosure may identify not only whether an aerosol-generating article is inserted but also the type of aerosol-generating article in each of the primary determination process and the secondary determination process. Accordingly, even when an aerosol-generating article is inserted into an accommodation space of the aerosol-generating device 20, in a case where the inserted aerosol-generating article does not correspond to a dedicated aerosol-generating article, a heating operation of the aerosol-generating device 20 may be prevented. Accordingly, use of unauthentic or incompatible aerosol-generating articles may be prevented.

FIG. 6 is a flowchart illustrating a method of operating an aerosol-generating device, according to an example embodiment.

Referring to FIG. 6, a method of operating an aerosol-generating device includes steps that are time-sequentially processed by the aerosol-generating device 10 or the aerosol-generating device 20 illustrated in FIG. 1 or FIG. 2. Accordingly, although omitted below, it can be seen that the details described above with respect to the aerosol-generating device 10 or the aerosol-generating device 20 of FIG. 1 or FIG. 2 may also be applied to the method of operating the aerosol-generating device illustrated in FIG. 6.

In step 610, an aerosol-generating device may determine whether an aerosol-generating article is inserted into an accommodation space of the aerosol-generating device based on a change in inductance detected by an inductive sensor. For example, the aerosol-generating device may determine that the aerosol-generating article is inserted into the accommodation space when a magnitude of a change in inductance detected by the inductive sensor exceeds a threshold. The threshold may be preset based on the type of aerosol-generating article.

In addition, when the change in inductance is detected by the inductive sensor but the magnitude of the change in inductance does not exceed the threshold, the aerosol-generating device may notify a user that a dedicated aerosol-generating article has to be inserted into the accommodation space.

In step 620, when it is determined that the aerosol-generating article is inserted into the accommodation space, the aerosol-generating device may apply a current to the induction coil to start heating the susceptor. Heating of the susceptor may be for smoking of the user using the aerosol-generating device.

In step 630, the aerosol-generating device may measure a frequency response of a coupling circuit formed by the current flowing through the induction coil. For example, the aerosol-generating device may measure a change in intensity of the current applied to the induction coil while changing a drive frequency of a battery that supplies power to the induction coil within a preset frequency scan range.

In step 640, the aerosol-generating device may determine whether to continue to heat the susceptor based on the measured frequency response. For example, the aerosol-generating device may determine whether to continue to heat the susceptor based on a change in intensity of the measured current while changing the drive frequency of the battery within the preset frequency scan range.

When a difference between a first frequency response and a second frequency response is within an error range, the aerosol-generating device may stop heating the susceptor. On the other hand, when the difference exceeds the error range, the aerosol-generating device may continue to heat the susceptor. The first frequency response may correspond to the frequency response measured while the aerosol-generating article is placed in the accommodation space, and the second frequency response may correspond to the frequency response measured while the aerosol-generating article is not inserted into the accommodation space. The second frequency response may be pre-stored in the aerosol-generating device.

The aerosol-generating device may determine a resonance frequency of the coupling circuit based on the change in intensity of the measured current and may identify the type of aerosol-generating article based on the determined resonance frequency. Even when the first frequency response and the second frequency response have the difference that exceeds the error range, in a case where it is determined that the type of aerosol-generating article is different from the type of aerosol-generating article stored in the aerosol-generating device, the aerosol-generating device may stop heating the susceptor. When it is determined that the type of aerosol-generating article is different from the type of aerosol-generating article stored in the aerosol-generating device, the aerosol-generating device may notify that a dedicated aerosol-generating article has to be inserted thereinto.

One embodiment may also be implemented in the form of a computer-readable recording medium including instructions executable by a computer, such as a program module executable by the computer. The computer-readable recording medium may be any available medium that may be accessed by a computer and includes both volatile and nonvolatile media, and removable and non-removable media. In addition, the computer-readable recording medium may include both a computer storage medium and a communication medium. The computer storage medium includes all of volatile and nonvolatile, and removable and non-removable media implemented by any method or technology for storage of information such as computer-readable instructions, data structures, program modules, or other data. The communication medium typically includes computer-readable instructions, data structures, other data in modulated data signals such as program modules, or other transmission mechanisms, and includes any information transfer media.

The descriptions of the above-described embodiments are merely examples, and it will be understood by one of ordinary skill in the art that various changes and equivalents thereof may be made. Accordingly, the scope of the disclosure should be defined by the appended claims, and all differences within the scope equivalent to those described in the claims will be construed as being included in the scope of protection defined by the claims.

What is claimed is:

1. An aerosol-generating device, comprising:
   an inductive sensor configured to detect a change in inductance;
   an induction coil configured to generate a time-varying magnetic field by a current;
   a susceptor configured to heat an aerosol-generating article inserted into an accommodation space of the aerosol-generating device according to the time-varying magnetic field; and
   a controller configured to:

determine whether the aerosol-generating article is inserted into the accommodation space based on the change in inductance detected by the inductive sensor, start heating the susceptor by applying the current to the induction coil based on determining that the aerosol-generating article is inserted into the accommodation space, measure a frequency response of a coupling circuit formed in response to the current being applied to the induction coil, and determine whether to continue to heat the susceptor based on the measured frequency response.

2. The aerosol-generating device of claim 1, wherein the controller determines that the aerosol-generating article is inserted into the accommodation space based on the change in inductance detected by the inductive sensor exceeding a threshold.

3. The aerosol-generating device of claim 2, wherein the threshold is preset based on a type of the aerosol-generating article.

4. The aerosol-generating device of claim 1, further comprising:

a battery configured to supply power to the induction coil, wherein the controller measures a change in the current while changing a driving frequency of the battery within a preset frequency scan range, and determines whether to continue to heat the susceptor based on the change in the current.

5. The aerosol-generating device of claim 4, wherein the controller stops heating the susceptor based on a difference between a first frequency response corresponding to the change in the current and a second frequency response that does not reflect the change in the current being within an error range, and continues to heat the susceptor based on the difference exceeding the error range.

6. The aerosol-generating device of claim 5, wherein the second frequency response corresponds to a frequency response measured while the aerosol-generating article is not inserted into the accommodation space, and is previously stored in the aerosol-generating device.

7. The aerosol-generating device of claim 4, wherein the controller determines a resonance frequency of the coupling circuit based on the change in the current, and identifies a type of the aerosol-generating article based on the determined resonance frequency.

8. The aerosol-generating device of claim 7, wherein the controller stops heating the susceptor based on the identified type of the aerosol-generating article being different from a type of aerosol-generating article stored in the aerosol-generating device.

9. The aerosol-generating device of claim 7, further comprising a user interface configured to output a notification that a dedicated aerosol-generating article has to be inserted into the accommodation space, based on the identified type of aerosol-generating article being different from the type of aerosol-generating article stored in the aerosol-generating device.

10. The aerosol-generating device of claim 1, further comprising a user interface configured to output a notification that a dedicated aerosol-generating article has to be inserted into the accommodation space, based on the change in inductance detected by the inductive sensor not exceeding a threshold.

11. A method of operating an aerosol-generating device, the method comprising:

determining whether the aerosol-generating article is inserted into an accommodation space of the aerosol-generating device, based on a change in inductance detected by an inductive sensor;

applying a current to an induction coil to start heating a susceptor based on determining that the aerosol-generating article is inserted into the accommodation space;

measuring a frequency response of a coupling circuit formed in response to the current being applied to the induction coil; and determining whether to continue to heat the susceptor based on the measured frequency response.

* * * * *